United States Patent
Yamada

(10) Patent No.: US 7,402,502 B2
(45) Date of Patent: Jul. 22, 2008

(54) METHOD OF MANUFACTURING A SEMICONDUCTOR DEVICE BY USING A MATRIX FRAME

(75) Inventor: Etsuo Yamada, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 194 days.

(21) Appl. No.: 10/942,799

(22) Filed: Sep. 17, 2004

(65) Prior Publication Data

US 2005/0142814 A1 Jun. 30, 2005

(30) Foreign Application Priority Data

Dec. 25, 2003 (JP) ............................. 2003-430438

(51) Int. Cl.
*H01L 21/46* (2006.01)
*H01L 21/78* (2006.01)
*H01L 21/301* (2006.01)
*H01L 21/30* (2006.01)
*H01L 21/44* (2006.01)

(52) U.S. Cl. .................. 438/460; 438/458; 438/106; 438/127

(58) Field of Classification Search ................ 438/460, 438/127, 124, 126, 106, 458
See application file for complete search history.

(56) References Cited

U.S. PATENT DOCUMENTS

| 5,355,017 | A  | * | 10/1994 | Nakamura et al. | 257/666 |
| 6,258,628 | B1 | * | 7/2001  | Osada et al.    | 438/111 |
| 6,720,207 | B2 | * | 4/2004  | Minamio et al.  | 438/123 |
| 6,841,414 | B1 | * | 1/2005  | Hu et al.       | 438/106 |
| 7,199,306 | B2 | * | 4/2007  | Owens           | 174/260 |
| 2005/0001292 | A1 | * | 1/2005 | Hatauchi        | 257/666 |
| 2005/0176171 | A1 | * | 8/2005 | Miyaki et al.   | 438/106 |

FOREIGN PATENT DOCUMENTS

| JP | 2000-124239 | 4/2000  |
| JP | 2001203228  | 7/2001  |
| JP | 2001298144  | 10/2001 |
| JP | 2002-43344  | 2/2002  |
| JP | 2003-133502 | 5/2003  |

* cited by examiner

*Primary Examiner*—Chuong A. Luu
(74) *Attorney, Agent, or Firm*—Volentine & Whitt, P.L.L.C.

(57) ABSTRACT

A method of manufacturing a semiconductor device includes providing a matrix frame which includes a plurality of die pads, mounting a semiconductor chip on the respective die pads, and sealing the semiconductor chip in blocks. After the semiconductor chip is sealed by the sealing resin, inner leads which are extended from the sealing resin are punched by a punching blade. Then, the block is diced to individual semiconductor devices by a rotary blade.

3 Claims, 4 Drawing Sheets

METHOD OF MANUFACTURING A SEMICONDUCTOR DEVICE BY USING A MATRIX FRAME

CROSS REFERENCE TO RELATED APPLICATION

A claim of priority under 35 U.S.C. §119 is made to Japanese Patent Application No. 2003-430438, filed Dec. 25, 2003, which is herein incorporated by reference in its entirety for all purposes.

BACKGROUND OF THE INVENTION

1. Field of the Invention

The present invention relates to a method of manufacturing a semiconductor device which has a sealing resin.

2. Description of the Related Art

A technique of manufacturing a semiconductor device using a matrix frame is disclosed in reference 1: Japanese Patent Laid-Open No. 2000-124239. The matrix frame which is disclosed in reference 1 includes a plurality of die pads which are arranged in a matrix. A semiconductor chip is mounted on the respective die pads. A couple of the semiconductor chips and the die pads are grouped and sealed in groups by a sealing resin. Such technique may be called a block molding method.

A reference 2: Japanese Patent Laid-Open No. 2002-43344 discloses a technique of manufacturing a semiconductor device using a matrix frame. The reference 2 discloses the following method. First, semiconductor chips are sealed in groups. Each of the groups includes a plurality of the semiconductor chips which are aligned. Then, each of the groups is separated. Finally, the sealed group is divided and individual semiconductor devices are obtained.

In the block molding method, only a peripheral area of the lead frame is clamped by a mold. Therefore, in a central area of the lead frame which is not clamped by the mold, a position of an inner lead might be moved, when a molding resin is injected in the mold.

Also, in the central area of the lead frame, a flash of the resin might be formed at a rear surface of the lead frame. It is difficult to remove the flash, and an additional step for removing the flash is needed.

Further, when the sealed block is divided by a dicing blade, a rotary speed of the dicing blade is decreased for cutting a lead frame enclosed by the sealing resin. Therefore, the dividing step requires a lot of time.

SUMMARY OF THE INVENTION

Accordingly, in one aspect of the present invention, a method of manufacturing a semiconductor device includes providing a matrix frame which includes a plurality of die pads, mounting a semiconductor chip on the respective die pads, and sealing the semiconductor chip in blocks. After the semiconductor chip is sealed by the sealing resin, inner leads which are extended from the sealing resin are punched by a punching blade. Then, the block is diced to individual semiconductor devices by a rotary blade.

DETAILED DESCRIPTION OF THE PREFERRED EMBODIMENTS

Figure 1:
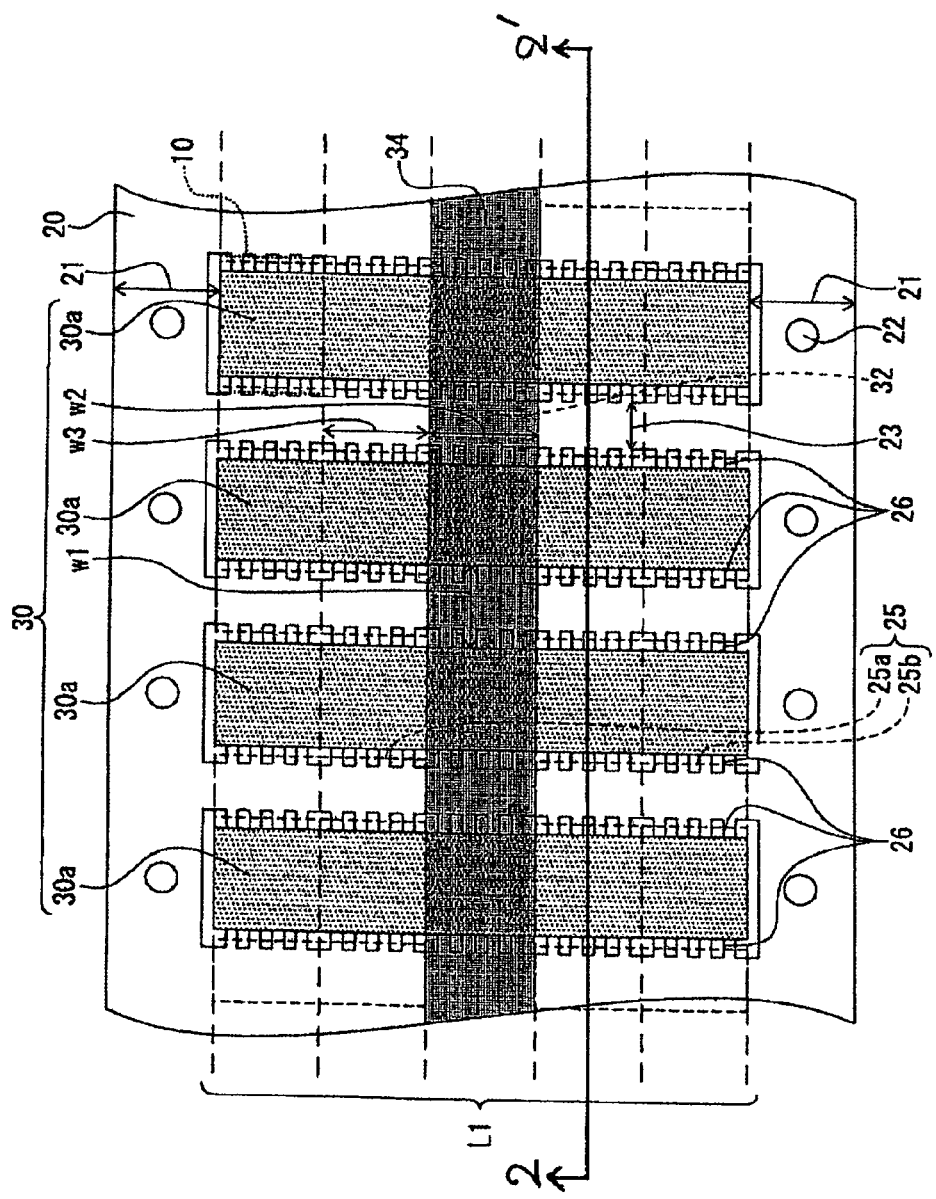
FIG. 1 is a plane view showing semiconductor devices of the present invention.

A method of manufacturing a semiconductor device according to preferred embodiments of the present invention will be explained hereinafter with reference to the accompanying figures. In order to simplify the explanation, like elements are given like or corresponding reference numerals. Dual explanations of the same elements are avoided.

Figure 4:
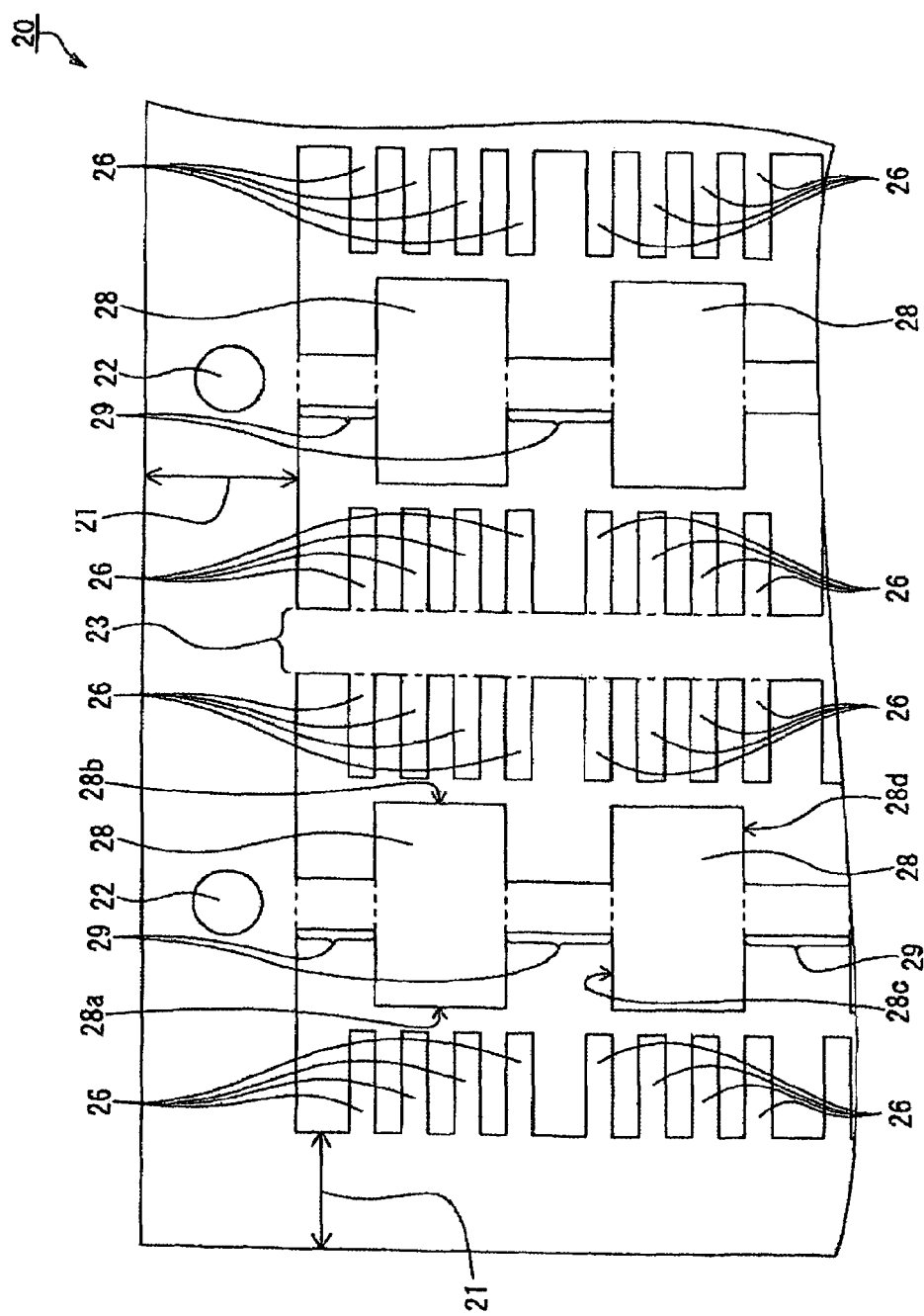
FIG. 4 is a plane view showing a matrix frame of the present invention.

Initially, a structure of a lead frame 20 of the present invention is described by referring to FIG. 4. The lead frame 20 is made from a metal plate such as copper and has a rectangular configuration. The lead frame 20 includes a plurality of die pads 28, a frame portion 21, supporting leads 29, connecting portions 23, and inner leads 26. Each of the part including the die pads 28, supporting leads 29, connecting portion 23, and inner leads 26 are formed by a punching method or by a etching method from the metal plate.

The die pads 28 are arranged in a matrix with a distance provided between each of the die pads 28. Each of the die pads 28 has a rectangular configuration. The die pad 28 has a first side 28a and a second side 28b which are extended in a vertical direction, and a third side 28c and a fourth side 28d which are extended to a horizontal direction.

The frame portion 21 is a peripheral area of the lead frame 20. That is, the frame portion 21 surrounds the die pads 28 at a distance from the die pads 28. Sprocket holes 22 are formed in parts of the frame portion 21 which are extended in a horizontal direction. The sprocket holes 22 are used for moving the lead frame 20.

The supporting leads 29 are formed between the frame portion 21 and the die pads 28 which are located near the outside of the die pads matrix. Also, the supporting leads 29 are formed between each of the die pads 28. As a result, the die pads 28 which are aligned in the vertical direction are supported between the upper side of the frame portion 21 and the lower side of the frame portion 21 by the supporting leads 29.

The connecting portions 23 are connected between the upper side of the frame portion 21 and the lower side of the frame portion 21.

The inner leads are extended from the connecting portions 23 and the frame portion 21 to the first sides 28a and the second sides 28b of the die pads 28 so that tips of the inner leads face the first sides 28a and the second sides 28b of the die pads 28. That is, the inner leads are extended in the horizontal direction.

Supporting leads 29 are connected to the frame portion 21. In this embodiment, the supporting leads 29 have a line configuration.

Figure 2:
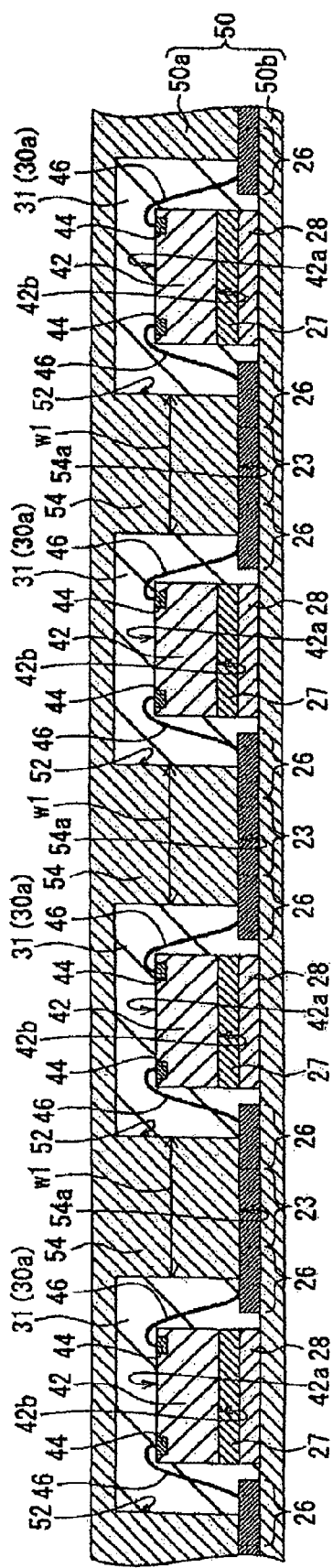
FIG. 2 is a cross-sectional view showing the semiconductor devices of the present invention.

Next, a method of manufacturing the semiconductor device is described by referring to FIG. 1 and FIG. 2.

FIG. 1 is a plane view showing semiconductor devices. FIG. 2 is a cross-sectional view taken along line 2-2' in FIG. 1. In FIG. 2, a mold is described for understanding a sealing step.

A row of the die pads 28 is used for a dummy area 34. In this embodiment, the dummy area 34 includes die pads 28 which are lined in the horizontal direction. The dummy area 34 is arranged in a middle of the die pad rows.

A semiconductor chip 42 is mounted on the respective die pads 28. In the dummy area 34, the semiconductor chip 42 is not mounted on the die pads 28. The semiconductor chip 42 includes a top surface 42a which includes a plurality of electrode pads 44 and a bottom surface 42b. The electrode pads 44 are arranged along the first side 28a and the second side 28b of the die pad 28.

In this embodiment, five rows of the die pads 28 and four columns of the die pads 28 are described in FIG. 1.

The semiconductor chip 42 is adhered on the die pad 28 by an insulating adhesive material 27 as shown in FIG. 2. Also an insulating adhesive tape can be used for the insulating adhesive material 27.

Then, the electrode pads 44 are connected to the inner leads 26 by bonding wires 46 as shown in FIG. 2. The electrode pads 44 correspond one-to-one with the inner leads 26.

Then, a sealing resin 31 is formed as shown in FIG. 2. The sealing resin 31 seals the semiconductor chips 42, the bonding wires 46, and the inner leads 26.

The sealing resin 31 is formed as block group 30. The block group 30 includes sealing resin blocks 30a. In this embodiment, each of the sealing resin blocks 30a is formed at every column of the die pads 28, and includes four semiconductor chips 42.

The sealing step is performed by setting the lead frame 20 between a mold 50 which includes an upper mold 50a and an lower mold 50b.

Cavities 52 are formed between the upper mold 50a and the lower mold 50b. Each of the die pad columns is arranged in the respective cavities 52.

Surfaces 54a of mold portions 54 which are located between cavities 52 are contacted to the connecting portion 23 and a part of the inner leads 26 of the lead frame 20, when the sealing step is performed.

A surface of the lower mold 50b is flat, and is contacted to an entire bottom surface of the lead frame 20.

After ejecting the lead frame 20 from the mold 50, a separating step is performed. In this embodiment, the separating step includes the following two steps.

A first step is a punching step by using a punching blade. A second step is a dicing step by using a rotary blade.

First, sides of the sealing resin blocks 30a are punched by the punching blade. The punching step can be performed by a punching mold which includes a plurality of the punching blades.

A rectangular or similarly shaped punching area 25 is shown by a broken line in FIG. 1. The punching blade has a rectangular punching surface which corresponds to the punching area 25. The punching blade punches the connecting portion 23 and a part of the inner leads 26. Now, a minimum width of commonly used punching blade is 3 mm to 4 mm. Therefore, a width of the connecting portion 23 should be shorter than a width of the punching blade, for punching the part of the inner leads 26.

The supporting portion 23 which is located in the dummy area 34 is not punched. That is, the punching step is performed at a first punching area 25a and a second punching area 25b which are located at both sides of the dummy area 34. After the punching step is performed, each of the sealing resin blocks 30a is connected by the supporting portions 23 which are located in the dummy area 34.

The rectangular punching area 25a and the rectangular punching area 25b can be punched simultaneously by using the punching mold. Each of the punching blades of the punching mold corresponds to the punching areas 25a and the punching areas 25b.

Then the dicing step is performed to the punched sealing resin blocks 30a, so that the respective semiconductor devices 10 are separated. The dicing step is performed by cutting the sealing blocks 30a at dicing lines L1 as shown in FIG. 1.

A width of the dummy area w2 is the same as a width of the width of the normal device area w3. As a result, the dicing step by using the rotary blade can be performed at even intervals.

In this dicing step, the sealing resin 31 and the supporting leads 29 are cut by the rotary blade. That is, the inner leads 26 are not cut by the rotary blade. Therefore, the dicing step can be performed in a short time. Also, the punching step which is performed to the inner leads 26 can inhibit a flash of the inner leads 26.

Figure 3A:
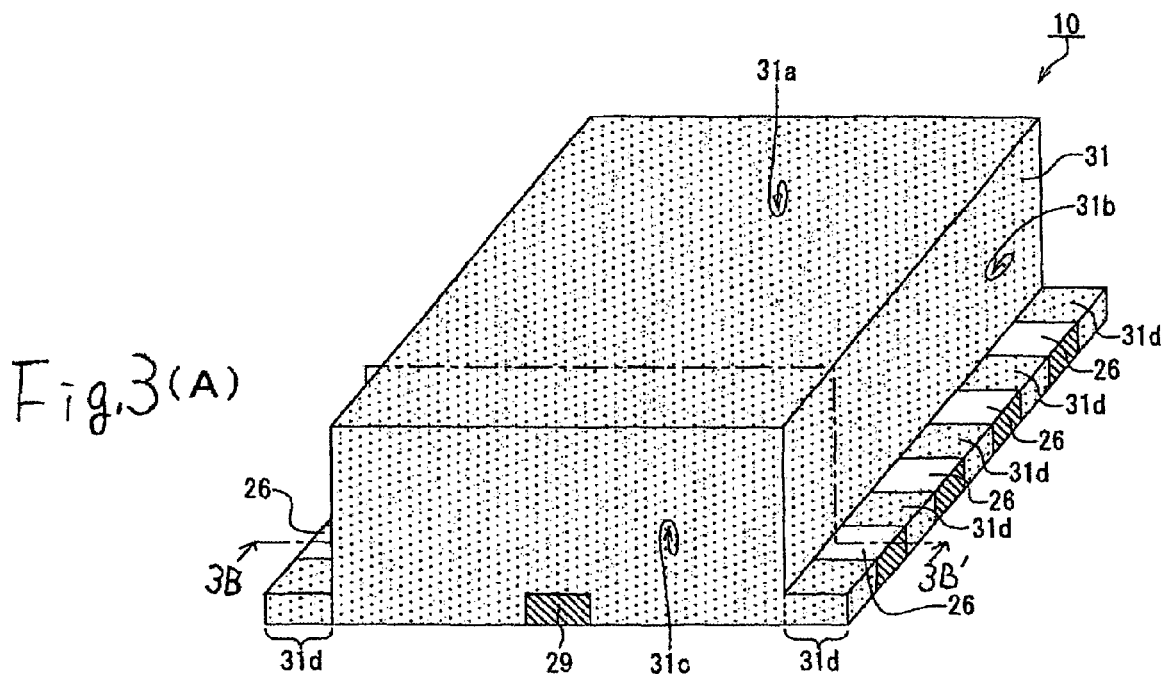
FIG. 3(A) to FIG. 3(C) are views showing the semiconductor device of the present invention.
Figure 3B:
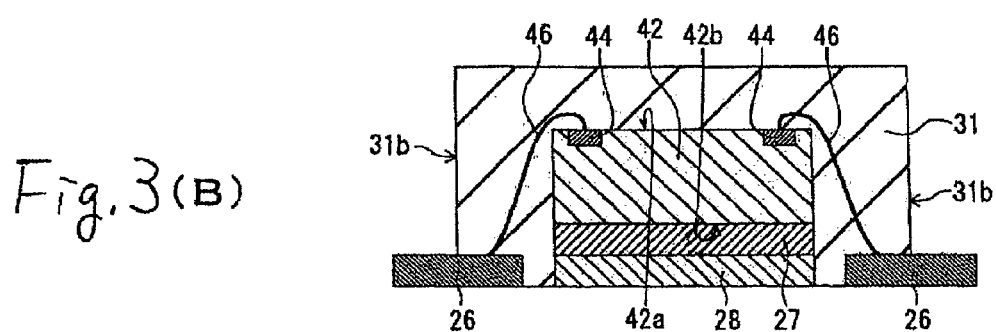
Figure 3C:
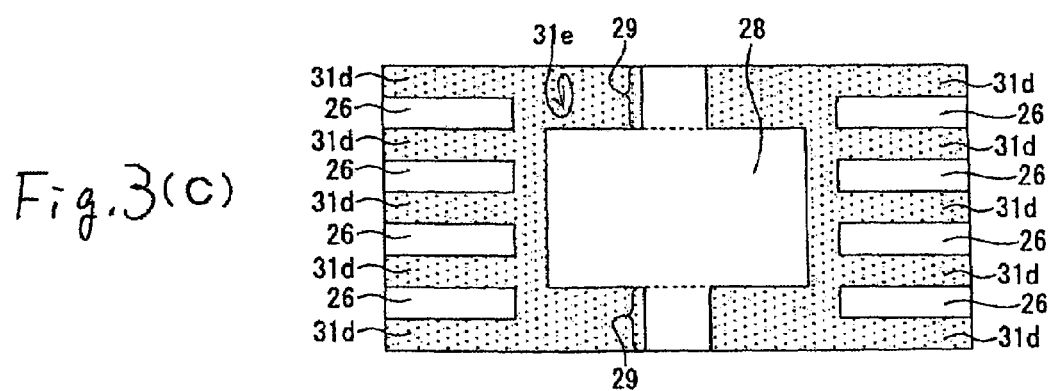

Next, the semiconductor device 10 which is manufactured by the method of this invention is described by referring to FIG. 3(A) to FIG. 3(C).

FIG. 3(A) is a schematic diagram showing the semiconductor device 10. FIG. 3(B) is a cross-sectional view taken along line 3(B)-3(B)' in FIG. 3(A). FIG. 3(C) is a bottom view showing the semiconductor device 10.

The semiconductor device 10 includes the semiconductor chip 42. The semiconductor chip includes the top surface 42a and the bottom surface 42b. The electrode pads 44 are formed on the top surface 42a.

The semiconductor chip 42 is mounted on the die pad 28 with the adhesive material 27.

The bottom surface of the inner leads 26 which are exposed from a bottom surface 31e of the semiconductor device 10 are used as external terminals. The sealing resin 31 is remaines between the external terminals 26 as resin portions 31d.

The external terminals 26 are project from both of the side surfaces 31b of the semiconductor device 10. The external terminals 26 are arranged at even intervals.

In the side surface 31c of the semiconductor device 10, a cutting surface of the supporting lead 29 is exposed as shown in FIG. 3(A).

While the preferred form of the present invention has been described, it is to be understood that modifications will be apparent to those skilled in the art without departing from the spirit of the invention. The scope of the invention is to be determined solely by the following claims.

What is claimed is:

1. A method of manufacturing a semiconductor device comprising:

providing a matrix frame which includes a frame portion which is arranged in a peripheral area of the matrix frame, a plurality of die pad groups each of which includes a plurality of die pads and a dummy pad which are arranged along a line, supporting leads which support the die pads, connecting portions which are arranged between respective die pad groups, and inner leads which are connected to the connecting portions;

mounting semiconductor chips on the die pads, the dummy pads having no semiconductor chips mounted thereon;

sealing the die pads, the dummy pads, the semiconductor chips, the inner leads, and the supporting leads by a sealing resin;

punching the connecting portions and the inner leads which are arranged between the die pads with a punching blade, wherein the inner leads and the connecting portions which are arranged between the respective dummy pads are not punched; and dicing the supporting leads and the resin between the respective die pads with a rotary blade.

2. The method of claim 1, wherein each of the dummy pads is arranged in a middle area of the respective die pad groups.

3. The method of claim 2, wherein the inner leads and the connecting portions which are separated by the dummy pads are punched simultaneously.

* * * * *